US012615773B2

(12) United States Patent
Zhang et al.

(10) Patent No.: US 12,615,773 B2
(45) Date of Patent: *Apr. 28, 2026

(54) THREE-DIMENSIONAL NAND MEMORY DEVICE WITH REDUCED RESISTANCE-CAPACITANCE DELAY

(71) Applicant: Yangtze Memory Technologies Co., Ltd., Wuhan (CN)

(72) Inventors: Zhong Zhang, Wuhan (CN); Zhongwang Sun, Wuhan (CN); Wenxi Zhou, Wuhan (CN); Zhiliang Xia, Wuhan (CN); Zhi Zhang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 101 days.

This patent is subject to a terminal disclaimer.

(21) Appl. No.: 18/075,487

(22) Filed: Dec. 6, 2022

(65) Prior Publication Data

US 2023/0098143 A1 Mar. 30, 2023

Related U.S. Application Data

(63) Continuation of application No. 16/853,828, filed on Apr. 21, 2020, now Pat. No. 11,587,945, which is a
(Continued)

(51) Int. Cl.
H10B 43/27 (2023.01)
G11C 8/14 (2006.01)
(Continued)

(52) U.S. Cl.
CPC .............. H10B 43/27 (2023.02); G11C 8/14 (2013.01); H10B 43/10 (2023.02); H10B 43/35 (2023.02); H10B 43/40 (2023.02)

(58) Field of Classification Search
CPC ........ H10B 69/00; H10B 53/00; H10B 53/10; H10B 53/20; H10B 53/30; H10B 53/40;
(Continued)

(56) References Cited

U.S. PATENT DOCUMENTS

| | | | |
|---|---|---|---|
| 8,748,970 B1 | 6/2014 | Lee et al. | |
| 8,759,217 B1* | 6/2014 | Chen ................. | H01L 21/76838 |
| | | | 438/689 |

(Continued)

FOREIGN PATENT DOCUMENTS

| | | |
|---|---|---|
| CN | 105810637 A | 7/2016 |
| CN | 105810639 A | 7/2016 |

(Continued)

OTHER PUBLICATIONS

Combined Taiwanese Office Action and Search Report issued on Jul. 31, 2024 in the corresponding Taiwanese Patent Application No. 113104651 (with English Translation of Category of Cited Documents), 5 pages.
(Continued)

*Primary Examiner* — William B Partridge
*Assistant Examiner* — Gustavo G Ramallo
(74) *Attorney, Agent, or Firm* — Oblon, McClelland, Maier & Neustadt, L.L.P.

(57) ABSTRACT

A semiconductor device is provided that can include a stack formed of word line layers and insulating layers that are alternatingly stacked over a substrate. A first staircase of a first block can be formed in the stack and extend between first array regions of the first block. A second staircase of a second block can be formed in the stack and extend between second array regions of the second block. The semiconductor device further can have a connection region that is formed in the stack between the first staircase and second staircase.

20 Claims, 11 Drawing Sheets

Related U.S. Application Data continuation of application No. PCT/CN2019/127921, filed on Dec. 24, 2019.

(51) Int. Cl.
 *H10B 43/10* (2023.01)
 *H10B 43/35* (2023.01)
 *H10B 43/40* (2023.01)

(58) Field of Classification Search
 CPC ........ H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50
 See application file for complete search history.

(56) References Cited

U.S. PATENT DOCUMENTS

| | | | |
|---|---|---|---|
| 11,088,157 B2 | 8/2021 | Hwang et al. | |
| 11,587,945 B2 * | 2/2023 | Zhang | G11C 8/14 |
| 11,871,573 B2 * | 1/2024 | Zhang | H10B 43/10 |
| 2008/0149992 A1 * | 6/2008 | Gidon | H01L 29/42332 |
| | | | 438/258 |
| 2012/0211823 A1 | 8/2012 | Lim et al. | |
| 2013/0032875 A1 * | 2/2013 | Yun | H10B 43/27 |
| | | | 257/314 |
| 2014/0295636 A1 * | 10/2014 | Makala | H10B 41/35 |
| | | | 438/287 |
| 2015/0155388 A1 | 6/2015 | Chen | |
| 2015/0228623 A1 | 8/2015 | Oh et al. | |
| 2016/0111361 A1 * | 4/2016 | Oh | H10B 43/50 |
| | | | 438/618 |
| 2017/0179028 A1 | 6/2017 | Lee et al. | |
| 2017/0256551 A1 * | 9/2017 | Lee | H10B 41/40 |
| 2018/0286743 A1 | 10/2018 | Chang | |
| 2019/0148295 A1 | 5/2019 | Lee et al. | |
| 2019/0287995 A1 | 9/2019 | Oike et al. | |
| 2019/0371406 A1 | 12/2019 | Yang et al. | |
| 2020/0194447 A1 | 6/2020 | Sun et al. | |
| 2021/0265268 A1 | 8/2021 | Su et al. | |

FOREIGN PATENT DOCUMENTS

| | | |
|---|---|---|
| CN | 102646678 B | 8/2016 |
| CN | 106992181 A | 7/2017 |
| CN | 107134458 A | 9/2017 |
| CN | 107546229 A | 1/2018 |
| CN | 107591406 A | 1/2018 |
| CN | 108550574 A | 9/2018 |
| CN | 109075190 A | 12/2018 |
| CN | 109155317 A | 1/2019 |
| CN | 109716521 A | 5/2019 |
| CN | 109754836 A | 5/2019 |
| CN | 109983577 A | 7/2019 |
| CN | 109997225 A | 7/2019 |
| CN | 110277394 A | 9/2019 |
| CN | 110447103 A | 11/2019 |
| CN | 110600481 A | 12/2019 |
| CN | 111244106 A | 6/2020 |
| CN | 113228275 A | 8/2021 |
| CN | 113228275 B | 4/2023 |
| TW | I656601 B | 4/2019 |

OTHER PUBLICATIONS

International Search Report and Written Opinion of the International Searching Authority issued Sep. 27, 2020, in PCT/CN2019/127921, (submitting English translation only), 4 pages.

Office Action issued Jun. 22, 2022, in corresponding Chinese Patent Application No. 201980003947.9.

Office Action issued Jun. 24, 2022, in corresponding Chinese Patent Application No. 202180000752.6.

Office Action issued Jun. 24, 2022, in corresponding Chinese Patent Application No. 202110040292.1.

Evidence of the China National Intellectual Property Administration of the People's Republic of China 3-1; Notice of First Examination Opinion, CN Application No. 201710134782.1, dated Jul. 18, 2018, with English translation, 52 pages.

Invalidation Request (Case Number 4W119560), CN Application No. 201980003947.9, dated Feb. 18, 2025, with English translation.

Invalidation Request (Case Number 4W119560), CN Application No. 201980003947.7, dated Mar. 28, 2025, with English translation.

Invalidity Reply to Patent Owner (Case Number 4W119560), CN Application No. 201980003947.9, dated May 30, 2025, with English translation.

Chinese Office Action issued Apr. 29, 2025 in Chinese Patent Application No. 201980003947.9 with English translation, 366 pgs.

* cited by examiner

100

102

110

112 104

106

112

108

Y

X

600

606

602

604

Z
Y
X

1000

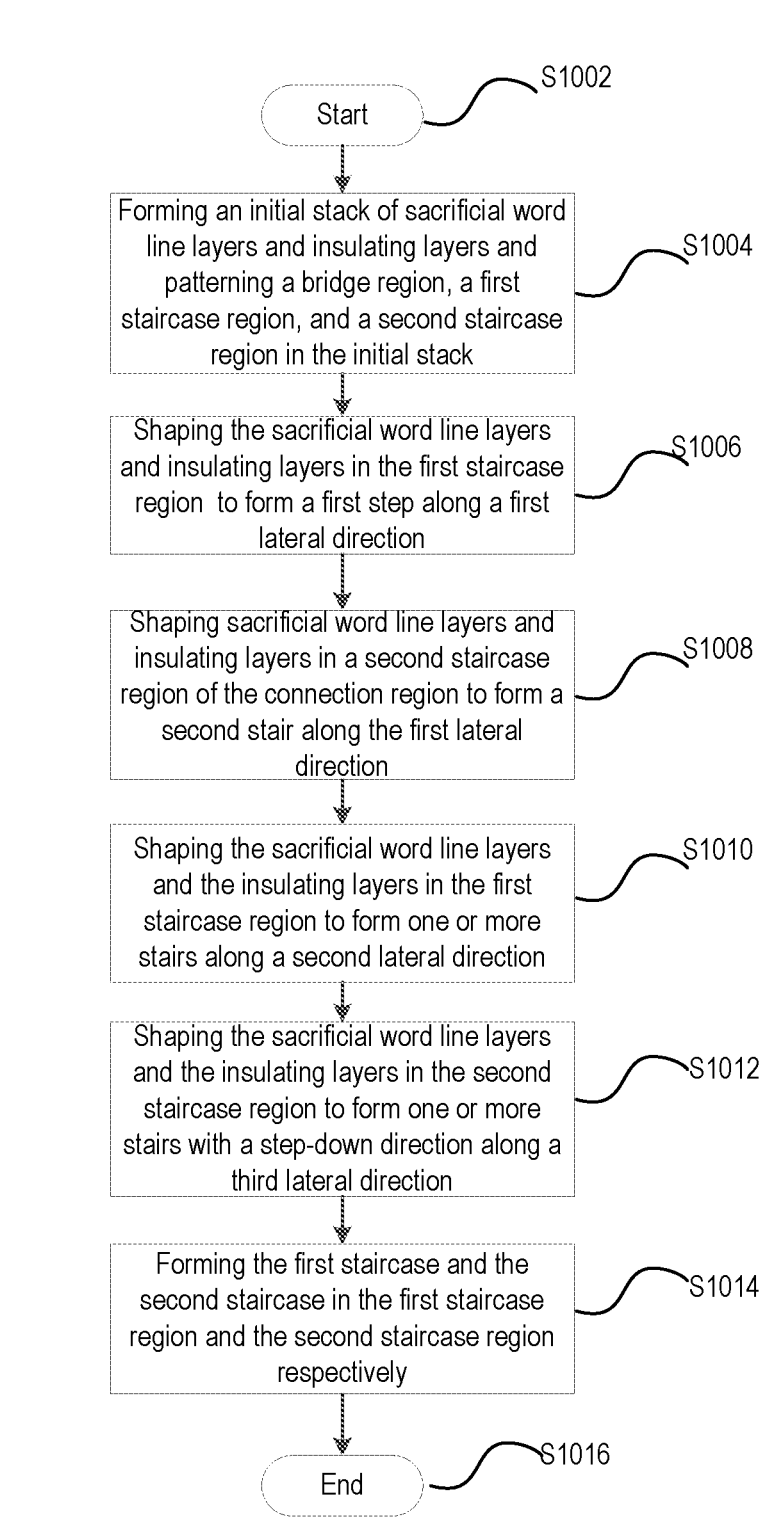

Start — S1002

Forming an initial stack of sacrificial word line layers and insulating layers and patterning a bridge region, a first staircase region, and a second staircase region in the initial stack — S1004

Shaping the sacrificial word line layers and insulating layers in the first staircase region to form a first step along a first lateral direction — S1006

Shaping sacrificial word line layers and insulating layers in a second staircase region of the connection region to form a second stair along the first lateral direction — S1008

Shaping the sacrificial word line layers and the insulating layers in the first staircase region to form one or more stairs along a second lateral direction — S1010

Shaping the sacrificial word line layers and the insulating layers in the second staircase region to form one or more stairs with a step-down direction along a third lateral direction — S1012

Forming the first staircase and the second staircase in the first staircase region and the second staircase region respectively — S1014

End — S1016

FIG. 10

THREE-DIMENSIONAL NAND MEMORY DEVICE WITH REDUCED RESISTANCE-CAPACITANCE DELAY

RELATED APPLICATION

This application is a continuation of U.S. application Ser. No. 16/853,828, filed on Apr. 21, 2020, which is a bypass continuation of International Application No. PCT/CN2019/127921, filed on Dec. 24, 2019. The entire disclosures of the prior applications are hereby incorporated by reference in its entirety.

BACKGROUND

Flash memory devices have recently been through a rapid development. The flash memory devices are able to retain the stored data for a very long period of time without applying a voltage. Further, the reading rate of the flash memory devices is relatively high, and it is easy to erase stored data and rewrite data into the flash memory devices. Thus, the flash memory devices have been widely used in micro-computers, automatic control systems, and the like. To increase the bit density and reduce the bit cost of the flash memory devices, three-dimensional (3D) NAND (Not AND) flash memory devices have been developed.

A 3D NAND device can include one or more memory planes, and each of memory planes can include a plurality of memory blocks. Each of the memory blocks can have an array region and one or more staircase regions. In such 3D NAND devices, each of the memory planes can have one or more decode structures that are positioned at boundaries of the plane. The staircase regions can be coupled to the decode structures through contact structures formed on the staircase regions. The decode structures are configured to define a block that is to be accessed and drive a needed voltage on to word line layers of the block.

SUMMARY

In a 3D NAND device, one or more decode structures can be positioned at boundaries of a memory plane (also referred to as plane) in the 3D NAND device to drive memory cells in the plane. Since the decode structures are positioned at the boundaries of the plane, drive currents applied to word line layers of the plane by the decode structures need to flow across an entire plane length in order to drive each memory cell in the plane. As the 3D NAND migrates towards high density and high capacity, especially from 64 layers (64 L) to 128 layers (128 L) architecture, layer (or film) dimensions of the 3D NAND are accordingly reduced. The reduced layer (or film) dimensions can result in an increased sheet resistance, which in turn causes a resistance-capacitance (RC) delay.

In present disclosure, the inventive concepts relate to a novel structure of a 3D NAND device, and more particularly, to a stair area that is arranged in a middle position of a plane of the 3D NAND device. The stair area can be further coupled to a decode structure. The decode structure accordingly can drive the plane in a range of a half plane. Therefore, the RC delay issue caused by the reduced layer (or film) dimensions can be relieved.

In the present disclosure, a semiconductor device is provided. The semiconductor device can include a stack formed of word line layers and insulating layers that are alternatingly stacked over a substrate. A first staircase of a first block can be formed in the stack and extend between first array regions of the first block. A second staircase of a second block can be formed in the stack and extend between second array regions of the second block. The semiconductor device further can have a connection region that is formed in the stack between the first staircase and second staircase.

The first staircase can have stairs extending in a declining step direction and stairs extending in an opposing inclining step direction. The stairs of the first staircase can further extend in a lateral step-down direction that is perpendicular to the inclining and declining step directions.

The second staircase can have stairs extending in the declining step direction and stairs extending in the opposing inclining step direction. The stairs of the second staircase can further extend in a direction opposite to the lateral step-down direction that is perpendicular to the declining and inclining step directions.

The semiconductor device includes channel structures. The channel structures can be formed in the connection region, the first array regions, and the second array regions, where the channel structures extend from the substrate and extend through the word line layers and the insulating layers of the stack. The semiconductor device can have first contact structures formed on the first staircase and connected to the word line layers in the first staircase, and second contact structures formed on the second staircase and connected to the word line layers in the second staircase.

In some embodiments, the first staircase and the second staircase are coupled to a decode structure through the first and second contact structures.

In the semiconductor device, a slit structure can be positioned in the connection region between the first staircase and the second staircase. The slit structure divides the connection region into a first portion and a second portion. The first block includes the first portion of the connection region, the first array regions, and the first staircase, where the first portion of the connection region is arranged adjacent the first staircase and connected to the first array regions. The second block includes the second portion of the connection region, the second array regions, and the second staircase, where the second portion of the connection region is arranged adjacent the second staircase and connected to the second array regions.

According to another aspect of the disclosure, a method for fabricating a semiconductor device is provided. In the disclosed method, an initial stack of sacrificial word line layers and insulating layers is formed over a substrate of the semiconductor device. The sacrificial word line layers and the insulating layers are disposed over the substrate alternately. A connection region, a first staircase region, and a second staircase region are then patterned in the initial stack. The first staircase region in the initial stack is subsequently shaped to form a first staircase, and the second staircase region in the initial stack is shaped to form a second staircase. The first staircase is formed in a first block of the initial stack and extends between first array regions of the first block. The second staircase is formed in a second block of the initial stack and extends between second array regions of the second block. The connection region is formed in the initial stack between the first staircase and second staircase.

In some embodiments, in order to form the first and second staircases, the sacrificial word line layers and insulating layers in the first staircase region can be shaped to form a first stair extending in a first lateral step-down direction, where the first stair divides the sacrificial word line layers and the insulating layers in the first staircase region into a first section and a second section. The sacrificial word line layers and insulating layers in the second staircase region can be shaped to form a second stair extending in the first lateral step-down direction, where the second stair divides the sacrificial word line layers and the insulating layers in the second staircase region into a third section and a fourth section. The first and second staircase regions are separated by the connection region.

The sacrificial word line layers and the insulating layers in the first staircase region are further shaped to form one or more stairs extending in a second lateral step-down direction, where the second lateral direction is perpendicular to the first lateral step-down direction. The sacrificial word line layers and the insulating layers in the second staircase region are shaped to form one or more stairs extending in a direction opposite to the second lateral step-down direction that is perpendicular to the first lateral step-down direction. A resist trim process and an etching process are then performed sequentially on the sacrificial word line layers and the insulating layers in the first and second staircase regions to form the first staircase and the second staircase in the first staircase region and the second staircase region respectively.

In the disclosed method, channel structures can be subsequently formed in the connection region, the first array regions and the second array regions of the initial stack, where the channel structures extend from the substrate and extend through the sacrificial word line layers and the insulating layers in the connection region, the first array regions and the second array regions of the initial stack. The sacrificial word line layers can then be replaced with word line layers that are made of a conductive material. Further, first contact structures on the first staircase, and second contact structures on the second can be formed. The first contact structures are connected to the word line layers in the first staircase, and the second contact structures are connected to the word line layers in the second staircase.

According to yet another aspect of the disclosure, a semiconductor device is provided. The semiconductor device includes a first portion of a plane of memory cells formed in a stack of word line layers and insulating layers. The word line layers and the insulating layers are stacked alternatingly over a substrate. The semiconductor device includes a second portion of the plane of memory cells formed in the stack. In the semiconductor device, a stair area is formed in the stack, where the stair area is positioned between the first portion and the second portion of the plane and coupled to a decode structure. The semiconductor device further includes a plurality of connection regions formed in the stack. The connection regions extend across the stair area between the first portion of the plane and the second portion of the plane so as to connect the first portion of the plane and the second portion of the plane, where a plurality of staircases are disposed in the stair area that are arranged between the connection regions in an alternating manner.

The semiconductor device can also include channel structures that are disposed in the first and second portions of the plane, and the connection regions. The channel structures extend from the substrate and extend through the word line layers and the insulating layers of the stack.

In some embodiments, each of the staircases further includes stairs extending in a declining step direction and stairs extending in an opposing inclining step direction. The stairs in each of the staircases further extend in a lateral step-down direction or a direction opposite to the lateral step-down direction, where the lateral step-down direction is perpendicular to the inclining and declining step directions.

Moreover, each of the staircases can be positioned between a first array region of the first portion of the plane and a second array region of the second portion of the plane.

In some embodiments, each of the staircases is coupled to a corresponding decode structure that can drive the plane. For example, the stairs extending in the declining step direction can be connected to the first array region and provide a control to drive the first array region. The stairs extending in the inclining step direction can be connected to the second array region and provide a control to drive the second array region.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10 is a flowchart of a process for manufacturing a 3D NAND device, in accordance with exemplary embodiments of the disclosure.

DETAILED DESCRIPTION

Figure 1:
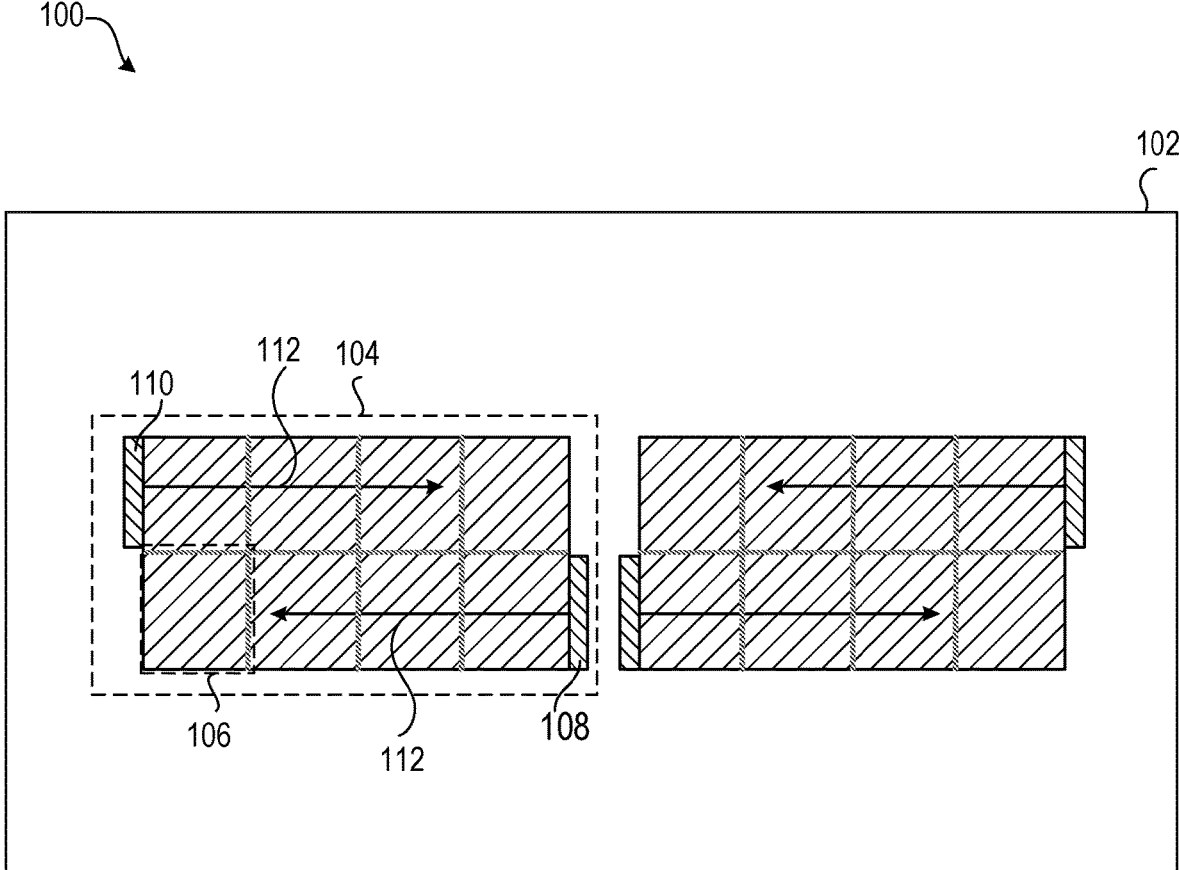
FIG. 1 is a schematic view of a related 3D NAND device, in accordance with exemplary embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic view of a related 3D NAND device 100. As shown in FIG. 1, the device 100 includes a memory portion 102 that are formed of three-dimensional (3D) memory cells. The memory portion 102 can include one or more memory planes (also referred to as planes) 104, and each of memory planes 104 can include a plurality of memory blocks (also referred to as blocks) 106. In some examples, concurrent operations can take place at the memory planes 104. In some embodiments, each of the memory blocks 106 is the smallest unit to carry out erase operations.

In the FIG. 1 example, the memory portion 102 includes two memory planes 104 and each of the two memory planes 104 includes eight memory blocks 106. Each of the memory blocks 106 can include a plurality of memory cells, and each memory cell can be addressed through interconnections, such as bit lines and word lines. In some examples, the bit lines and word lines can be laid out perpendicularly, forming an array of metal lines. For example, the word lines extend in the X direction, and the bit lines extend in the Y direction.

Still referring to FIG. 1, each of memory planes 104 can include one or more decode structures that are positioned at boundaries of the memory plane. For example, a first decode structure 110 is positioned at an upper left corner of the memory plane 104, and a second decode structure 108 is positioned at a lower right corner of the memory plane 104. The decode structures 108-110 can be circuitries to select which block in the memory plane is to be accessed and drive a needed voltage on to word line layers of the memory plane. Since the decode structures are positioned at the boundaries of the plane, drive currents (e.g., 112) applied to the word line layers of the plane by the decode structures need to flow across the entire plane in order to drive each memory cell in the plane. As the 3D NAND migrates towards high density and high capacity, especially from 64 L to 128 L architecture, layer (or film) dimensions of the 3D NAND are accordingly reduced. The reduced layer (or film) dimensions can result in a sheet resistance reduction, which in turn causes a resistance-capacitance (RC) delay.

Figure 2:
FIG. 2 is a schematic view a 3D NAND device, in accordance with exemplary embodiments of the disclosure.
Figure 2:
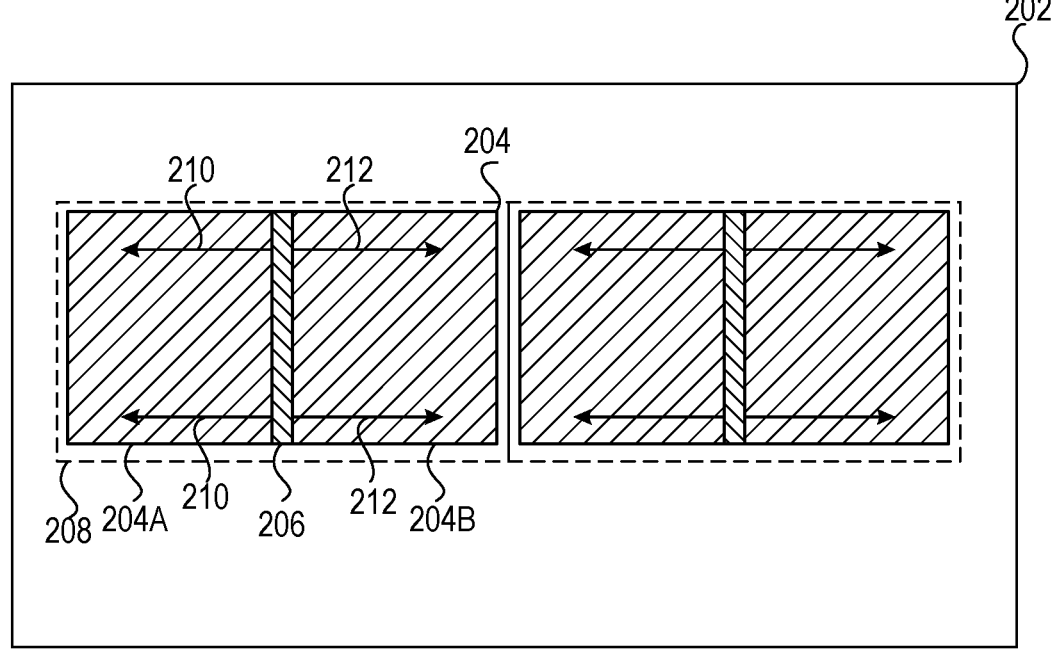

FIG. 2 is a top down view of a disclosed 3D NAND device 200, in accordance with some embodiments of the present disclosure. As shown in FIG. 2, the device 200 includes a memory portion 202 that are formed of three-dimensional (3D) memory cells. The memory portion 202 can include one or more memory planes 204 that are formed in a stack of word line layers and insulating layers, where the word line layers and the insulating layers are stacked alternatingly over a substrate of the 3D NAND device. In an exemplary embodiment of FIG. 2, two memory planes are included in the memory portion 202.

Still referring to FIG. 2, each of the memory planes 204 can have a first portion 204A, a second portion 204B and a stair area 206. The stair area 206 can be positioned between the first portion 204A and the second portion 204B of the plane 204 and coupled to a decode structure (not shown). In an example, the decode structure can be positioned in the stair area 206. In another example, the decode structure can be positioned in a dedicated location (e.g., a periphery location) of the 3D NAND device 200. In some embodiments, a dummy stair area 208 can be formed surrounding the plane 204. The dummy stair area can be formed in a steep manner so as to save a layout area of the plane. In some embodiments, the dummy stair area can be configured to separate the planes 204 in the 3D NAND device 200 from one another.

In the stair area, a plurality of staircases are formed. The staircases are formed in the stack of word line layers and insulating layers, and coupled to the decode structure through a plurality of contact structures that can be shown in FIG. 4. Accordingly, the decode structures can apply drive voltage on to the word lines of the plane through the staircases in the stair area. Since the stair area is disposed in a middle position of the plane, drive currents generated by the decode structures only need to flow across a half plane length in order to drive each memory cell in the plane. For example, the plane 204 can be driven by a drive current 210 that flows across the first portion 204A and a drive current 212 that flows across the second portion 204B. In the 3D NAND device 200, each of the planes is driven along a direction from the middle position of the plane to two sides of the plane, and an effective flow length of the driven current is accordingly reduced by half. Thus a total resistance can be reduced by the reduced flow length, which in turns compensates an increased sheet resistance due to the reduced layer (or film) dimensions.

Figure 3:
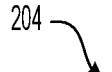
FIG. 3 is an expanded schematic view of a 3D NAND device, in accordance with exemplary embodiments of the disclosure.
Figure 3:
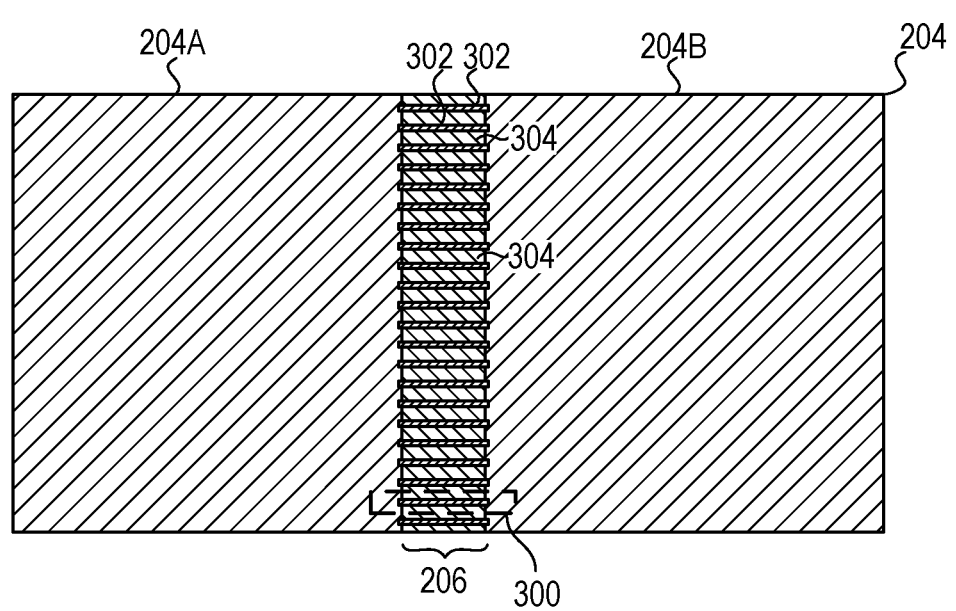

FIG. 3 is an expanded schematic view of a plane in the 3D NAND device 200. As shown in FIG. 3, a plurality of connection regions 302 can be formed in the stack and extend across the stair area 206 between the first portion 204A and the second portion 204B of the plane 204 so as to connect the first and second portions 204A-204B. In addition, a plurality of staircases 304 can be disposed in the stair area 206, and arranged between the connection regions 302 in an alternating manner. In order to form the connection regions and the staircases, a block layer (e.g., a TiN layer) can be deposited over the stair area 206. A patterning process, such as a combination of a photolithography process and an etching process, can be subsequently applied to remove portions of the block layer to form a plurality of uncovered regions in the stair area, and remaining portions of the block layer become the connection regions 302. A resist trim process and an etching process can be applied sequentially in the uncovered regions of the stair area to form the staircases 304. The intermediate steps to form the staircases can be illustrated in FIGS. 6-9.

Figure 4A:
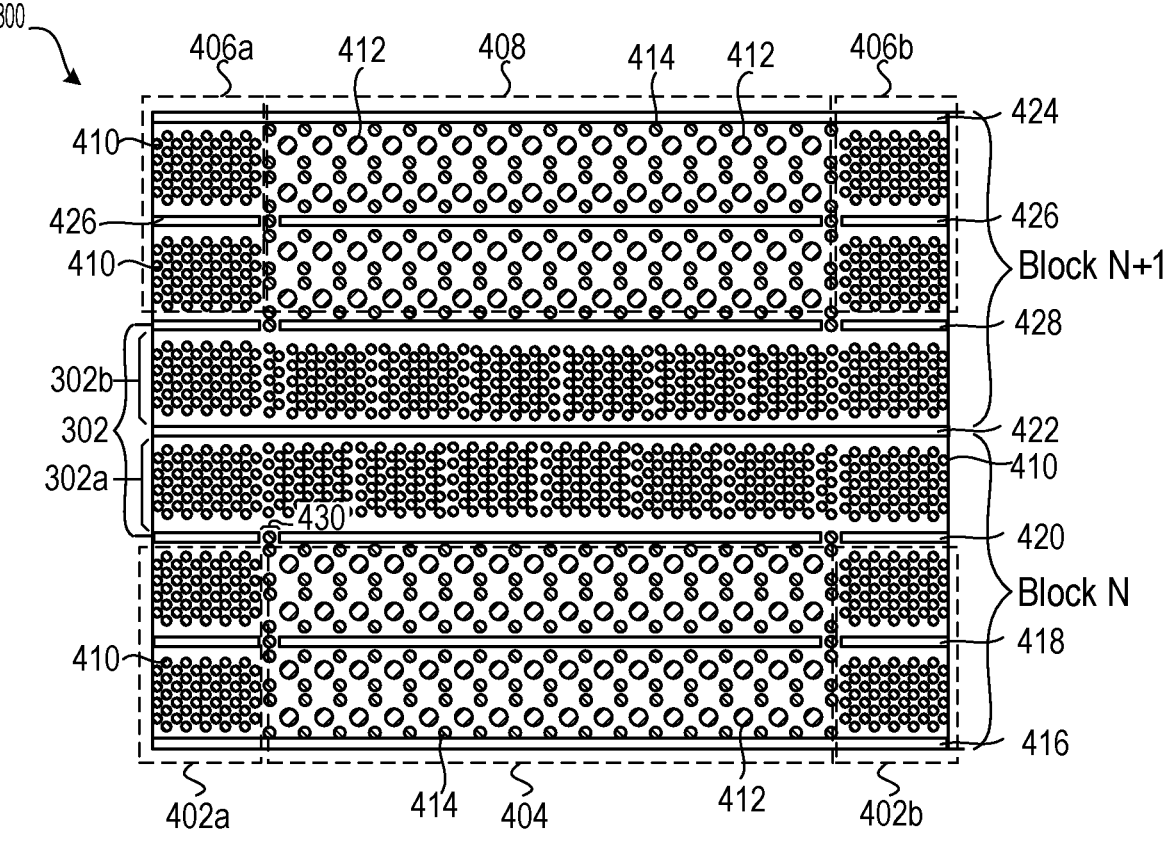
FIG. 4A is a top down expanded view of a stair area in a 3D NAND device, in accordance with exemplary embodiments of the disclosure.

FIG. 4A is a top down expanded view of a stair area in a 3D NAND device, in accordance with exemplary embodiments of the disclosure. The expanded view can be taken from an area 300 of the stair area 206 that is illustrated in FIG. 3. The area 300 can include two first array regions 402a-402b, and a first staircase 404 that is positioned between the two first array regions 402a-402b. The first array regions 402a-402b and the first staircase 404 can be included in a first block, block N, where the N can be a positive integer. The area 300 can also include two second array regions 406a-406b, and a second staircase 408 that is positioned between the two second array regions 406a-406b. The second array regions 406a-406b and the second staircase 408 can be included in a second block, block N+1.

A connection region 302 is positioned between the first staircase 404 and the second staircase 408. A slit structure 422 is positioned in the connection region 302 between the first staircase 404 and the second staircase 408 and divides the connection region 302 into a first portion 302a and a second portion 302b. The first block (e.g., block N) includes the first portion 302a of the connection region 302, the first array regions 402a-402b, and the first staircase 404, where the first portion 302a of the connection region is arranged adjacent the first staircase 404 and connected to the first array regions 42a-402b. The second block (e.g., block N+1) includes the second portion 302b of the connection region 302, the second array regions 406a-406b, and the second staircase 408, where the second portion 302b of the connection region 302 is arranged adjacent the second staircase 408 and connected to the first array regions 406a-406b.

The first and second staircases 404 and 408 can have a plurality of dummy channel structures 414. The dummy channel structures can be disposed at suitable places for process variation control during fabrication and/or for additional mechanical support. The first and second staircases 404 and 408 can also have a plurality contact structures 412 that are positioned on the stairs of the first and second staircases and connected to the word line layers of the first and second staircases. The contact structures 412 can extend from the stairs of the first and second staircases and further be connected to metal layers (e.g., M0 layer, M1 layer) of the backend of line (BEOL), where the metal layers are stacked over the contact structures 414. In some embodiments, the contact structures 412 can connect the first and second staircases to the decode structure so that the decode structure can apply the drive voltage onto the word line layers in the first and second staircases.

In the connection region 302, the first array regions 402a-402b and the second array regions 406a-406b, a plurality of channel structures 410 are disposed. The channel structures 410 can extend from the substrate and extend through the word line layers so as to form an array of vertical memory cell strings. Each of the vertical memory cell string can include a corresponding channel structure that is coupled to the word line layers to form one or more bottom select transistors (BSTs), a plurality of memory cells (MCs), and one or more top select transistors (TSTs). The BSTs, MCs and TSTs are disposed sequentially and in series over the substrate. Each of the channel structures can further include a channel layer, a tunneling layer that surrounds the channel layer, a charge trapping layer that surrounds the tunneling layer, and a barrier layer that surrounds the charge trapping layer and further is in direct contact to the word line layers. In some embodiments, a high-K layer, such as $HfO_2$ or AlO, can be disposed between the word line layers and the barrier layer.

The area 300 can have a plurality of slit structures (or gate line slits) 416-428. The slit structures can have a trench profile, and extend from the substrate and extend through the stack 600. In some embodiments, the slit structures can be made of conductive materials and positioned on array common source (ACS) regions to serve as contacts, where the ACS regions are formed in the substrate to sever as common sources. In some embodiments, the slit structures can be made of dielectric materials to serve as separation structures.

The slit structure 422 can be a shared slit structure by the block N and the block N+1, and separate the block N and the block N+1 from one another. The slit structures 416-420 can be included in the block N. The slit structure 416 is position at a bottom boundary of the block N with a continuous configuration. The slit structures 418 and 420 are disposed within the block N with a discontinuous configuration, where one or more gaps (e.g., 430) are disposed in the slit structures 418-420. Accordingly, the channel structures in the block N can be coupled to each other. Similarly, the slit structures 424-428 can be included in the block N+1. The slit structure 424 is position at a top boundary of the block N+1 with a continuous configuration. The slit structures 426 and 428 are disposed within the block N+1 with a discontinuous configuration, where one or more gaps are disposed in the slit structures 426-428. Accordingly, the channel structures in the block N+1 can be coupled to each other.

Figure 4B:
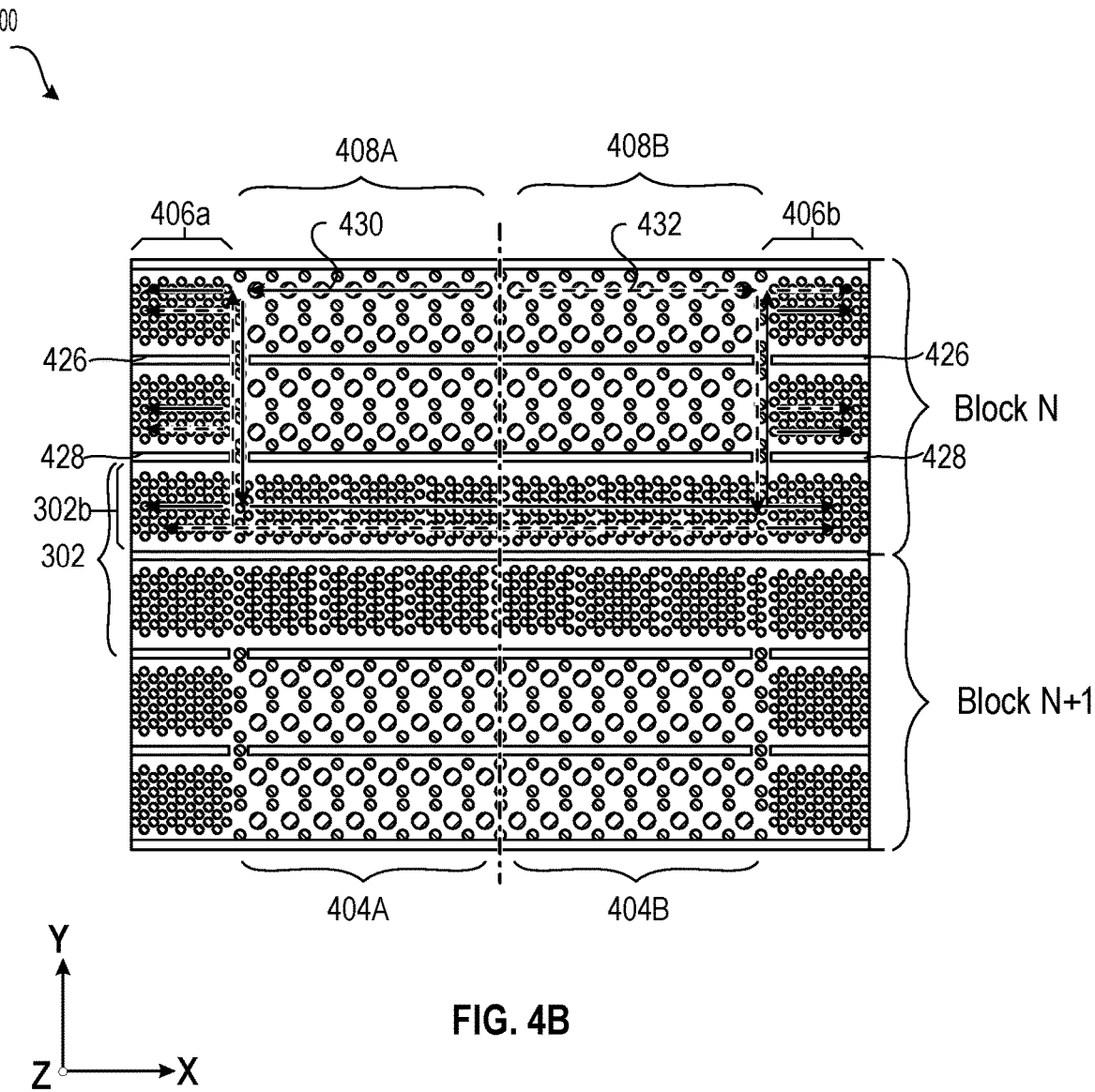
FIG. 4B is a schematic diagram of flow paths of driven currents in a stair area of a 3D NAND device, in accordance with exemplary embodiments of the disclosure.

FIG. 4B is a schematic diagram of flow paths of driven currents in the area 300 of the stair area 206. As shown in FIG. 4B, the first staircase 404 can have a first group of stairs 404A and a second group of stairs 404B. The second staircase 408 can have a third group of stairs 408A and a fourth group of stairs 408B. In some embodiments, the first group of stairs 404A can provide a control to the first array region 402a, and the second group of stairs 404B can provide a control to the first array region 402b. The third group of stairs 408A can provide a control to the second array region 406a, and the fourth group of stairs 408B can provide a control to the second array region 406b. The first portion 302a of the connection region 302 can be configured to couple the controls to the first array regions 402a-402b, and the second portion 302b of the connection region 302 can be configured to couple the controls to the second array regions 406a-406b.

Still referring to FIG. 4B, for simplicity and clarity, the flow paths of the driven currents generated by the decode structure are illustrated in the block N+1. When drive voltages are applied by the decode structures (not shown) onto the word line layers in the second staircase 408 through the contact structures 412, the generated drive currents can have a first current portion 430 and a second current portion 432. The first current portion 430 can flow from the third group of stairs 408A toward to the second array region 406a. The first current portion 430 can further flow through the gaps of the slit structures 426 and 428, and flow to the second array region 406b via the second portion 302b of the connection region 302.

Similarly, the second current portion 432 can flow from the fourth group of stairs 408B toward to the second array region 406b. The second current portion 432 can further flow through the gaps of the slit structures 426 and 428, and flow to the second array region 406a via the second portion 302b of the connection region 302. In some embodiments, the second array region 406a can be included in the first portion 204A of the plane 204 in FIG. 3, and the second array region 406b can be included in the second portion 204B of the plane 204. Thus, the drive currents can flow from the stair area to the first and second portions of the plain simultaneously, and drive the memory cells in the plain in a reduced flow range comparing to a related 3D NAND device (e.g., the 3D NAND device 100 in FIG. 1).

Figure 5:
FIG. 5 is a three-dimensional expanded view of a stair area in a 3D NAND device, in accordance with exemplary embodiments of the disclosure.
Figure 5:
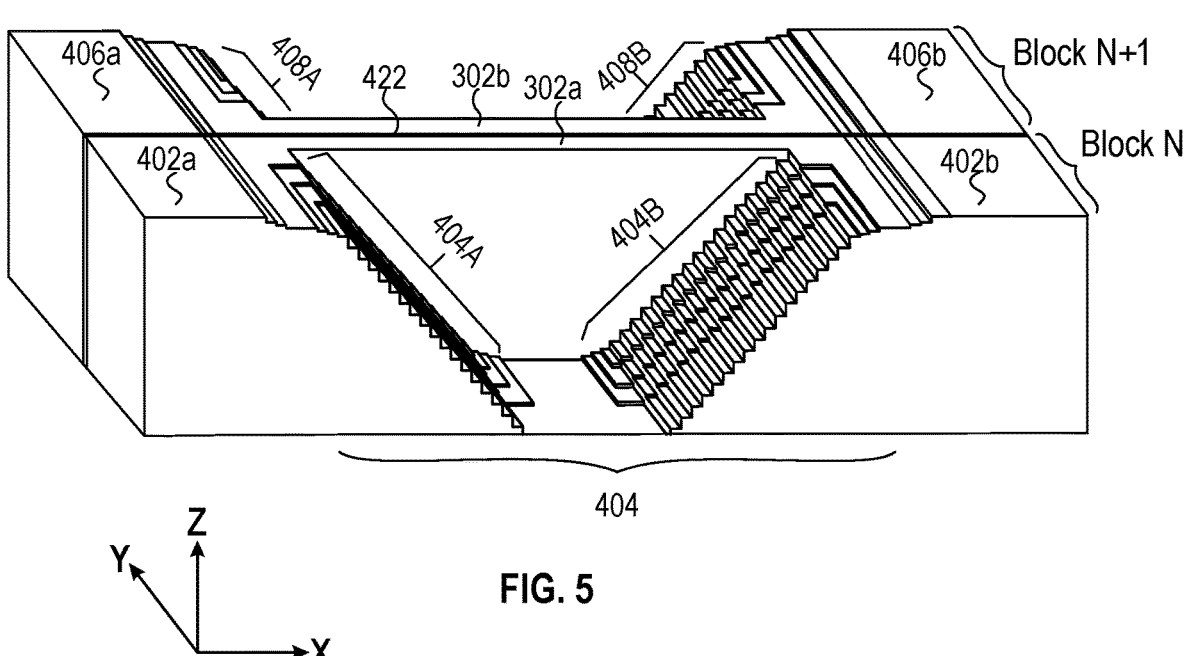

FIG. 5 is a three-dimensional view of the area 300 obtained from the stair area 206 in the 3D NAND device. For simplicity and clarity, the channel structures 410, the dummy channel structures 414, and the contact structures 412 are not included in FIG. 5. As shown in FIG. 5, the first staircase 404 can have the first group of stairs 404A extending in a declining step direction (e.g., X direction) and a second group of stairs 404B extending in an opposing inclining step direction (e.g., X direction). In addition, the first group of stairs and the second group of stairs in the first staircase further extend in a lateral step-down direction (e.g., −Y direction) that is perpendicular to the inclining and declining step directions. In an exemplary embodiment of FIG. 5, the first group of stairs and the second group of stairs can have four steps along the lateral step-down direction. The four steps can accordingly divide the first group of stairs and the second group of stairs into four divided regions along the lateral step-down direction.

Similarly, the second staircase 408 can have the third group of stairs 408A extending in the declining step direction (e.g., X direction) and the fourth group of stairs 408B extending in the opposing inclining step direction (e.g., X direction). The third group of stairs and the fourth group of stairs in the second staircase further extend in a direction opposite to the lateral step-down direction (e.g., Y direction) that is perpendicular to the inclining and declining step directions.

It should be noted that FIGS. 4 and 5 are merely an example, and the first and second staircases 404 and 408 can have any number of groups of stairs. In addition, each of the groups of stairs can have any number of stairs according to the device structure.

Figure 6:
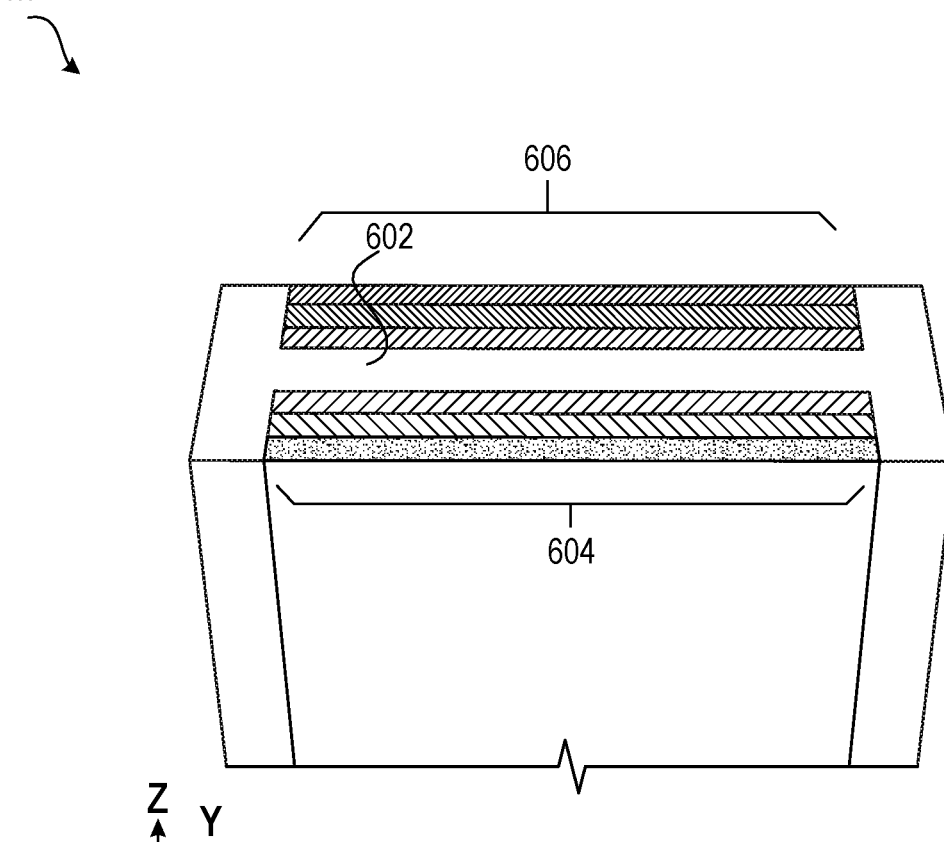
FIGS. 6 through 9 are three-dimensional views of various intermediate steps of manufacturing a 3D NAND device, in accordance with exemplary embodiments of the disclosure.

FIGS. 6 through 9 are three-dimensional views of various intermediate steps of manufacturing a 3D NAND device. In FIG. 6, a stack 600 of word line layers and insulating layers are provided. The word line layers and the insulating layers are disposed alternatingly over a substrate (not shown). In some embodiments, the word line layers formed in the stack 600 can be sacrificial word line layers, and the sacrificial word line layers can be replaced with a conductive material to form word line layers in subsequent manufacturing steps. In some embodiments, the sacrificial word line layers can be made of SiN, and the insulating layers can be made of SiO. Any suitable deposition process can be applied to form the sacrificial word line layers and the insulating layers. For example, a chemical vapor deposition (CVD) process, a physical vapor deposition (PVD) process, a diffusion process, an atomic layer deposition (ALD) process, or other suitable deposition processes can be applied.

Still referring to FIG. 6, a connection region 602, a first staircase region 604, and a second staircase region 606 can be formed in the initial stack through a patterning process. For example, a block layer (not shown), such as a TiN layer, can be deposited over a top surface of the initial stack 600. A photolithography process can be applied to form a patterned mask layer (e.g., a patterned photoresist layer) that exposes the block layer in the first staircase region 604 and the second staircase region 606. An etching process can be subsequently applied to remove the block layer in the first staircase region 604 and the second staircase region 606 so that the word line layers in the first and second staircase regions 604-606 are uncovered. Accordingly, a region with the remaining block layer becomes the connection region 602.

Figure 7:
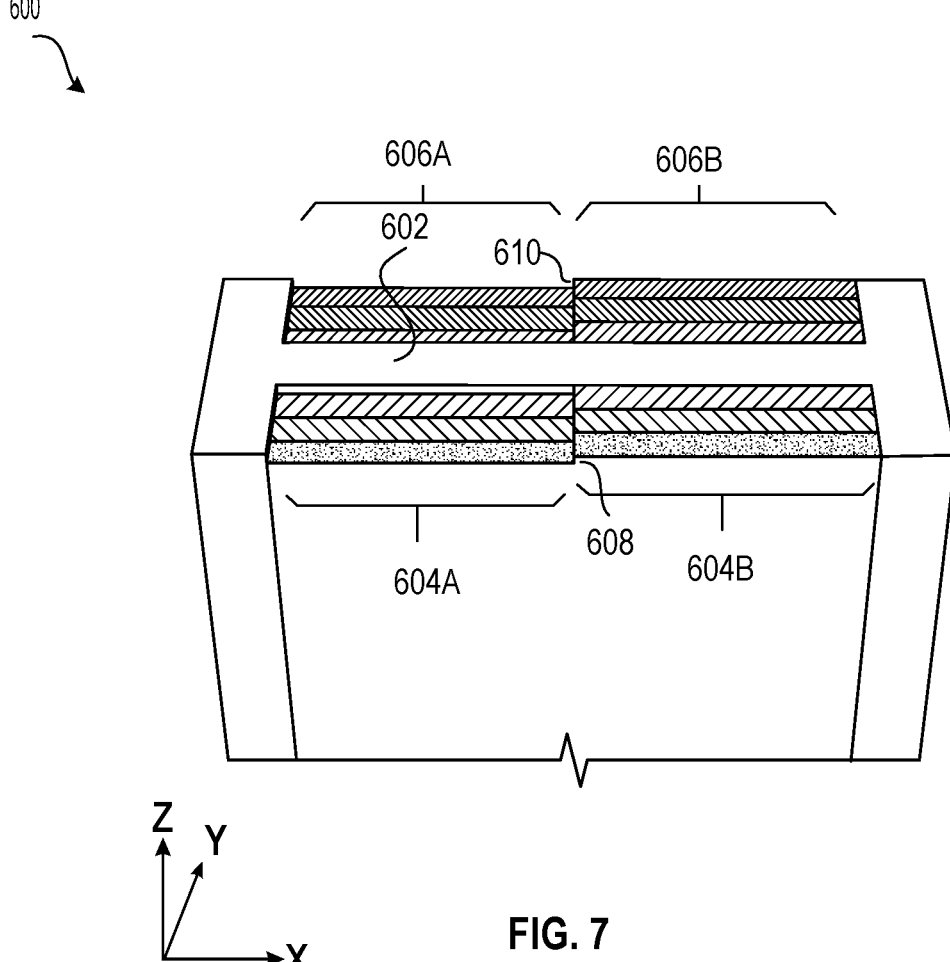

In FIG. 7, the photolithography process and the etching process can further be applied to form a first stair 608 in the first staircase region 604 and a second stair 610 in the second staircase region 606. The sacrificial word line layers and insulating layers in the first staircase region 604 can be shaped to form the first stair 608 extending in a first lateral step-down direction (e.g., −X direction) parallel to the substrate, where the first stair 608 divides the sacrificial word line layers and the insulating layers in the first staircase region 604 into a first section 604A and a second section 604B. In addition, the sacrificial word line layers and insulating layers in the second staircase region 606 of the stack 600 can be shaped to form the second stair 610 extending in the first lateral step-down direction, where the second stair 610 divides the sacrificial word line layers and the insulating layers in the second staircase region 606 into a third section 606A and a fourth section 606B.

In order to form the first and second stairs 608 and 610, the photolithography process can apply a patterned mask layer over the top surface of the stack 600, where the patterned mask layer exposes the first section 604A of the first staircase region 604 and the third section 606A of the second staircase region 606. The etching process can be applied subsequently to remove portions of the sacrificial word line layers and insulating layers in the first section 604A of the first staircase region 604 and in the third section 606A of the second staircase region 606 respectively. The stairs 608 and 610 can be formed accordingly upon the completion of the etching process.

Figure 8:
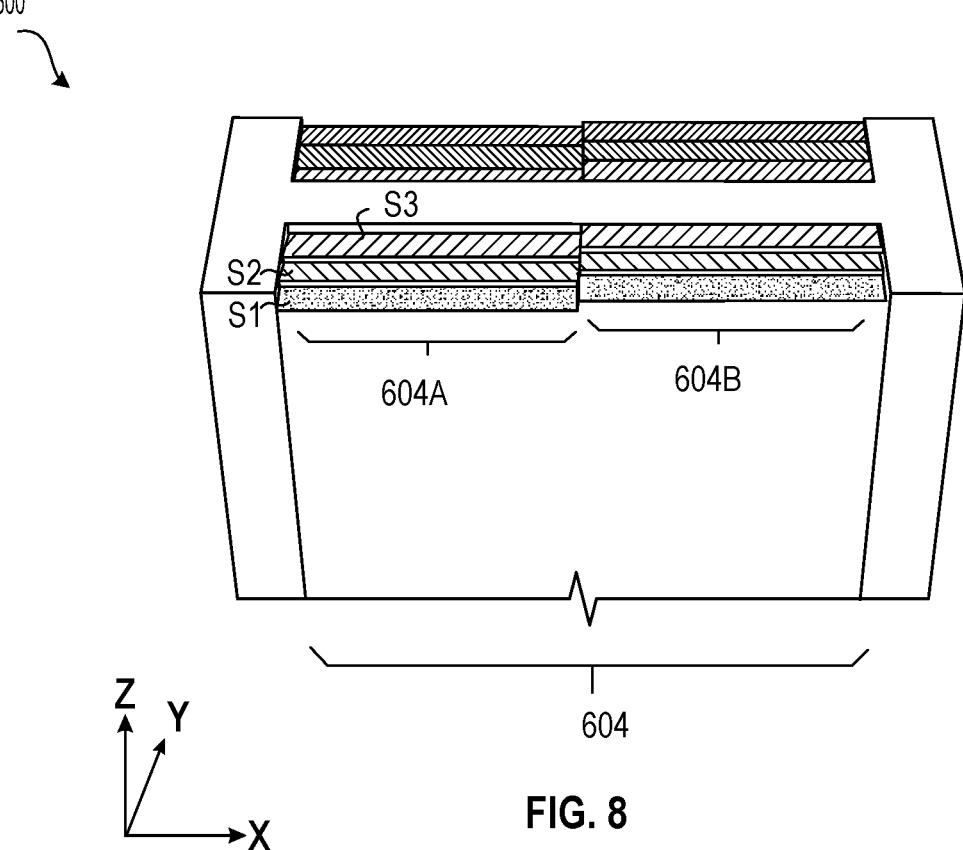

In FIG. 8, the sacrificial word line layers and the insulating layers in the first staircase region 604 can be shaped to form one or more stairs extending in a second lateral step-down direction (e.g., −Y direction), where the second lateral step-down direction is perpendicular to the first lateral step-down direction (e.g., −X direction). For example, as shown in FIG. 8, three stairs can be formed in the first and second sections 604A-604B of the first staircase region 604 along the −Y direction. Moreover, the sacrificial word line layers and the insulating layers in the second staircase region 606 can be shaped to form one or more stairs extending in a third lateral step-down direction opposite to the second lateral step-down direction (e.g., Y direction).

In order to form the one or more stairs along the second and third lateral step-down directions in the first and second staircase regions, a resist trim and an etching process can be operated sequentially. For example, a resist layer can be deposited on the first section 604A of the first staircase region 604. A photolithography process can expose a first part S1 of the first section 604A along the second lateral step-down direction (e.g., −Y direction). A plasma etching process can be applied to remove portion of the word line layers and insulating layers in the exposed first part S1. A resist trim process, such as a plasma ashing process, can be subsequently applied to expose a second part S2 of the first section 604A along the second lateral step-down direction, and the plasm etching process can be applied to remove portions of the word line layers and insulating layers in the exposed second part S2 and the exposed first part S1. The plasma ashing process can be applied again to remove a remaining resist layer. Once the remaining resist layer is removed, three stairs can be formed in the first section 604A of the first staircase region 604 along the second lateral step-down direction (−Y direction).

Figure 9:
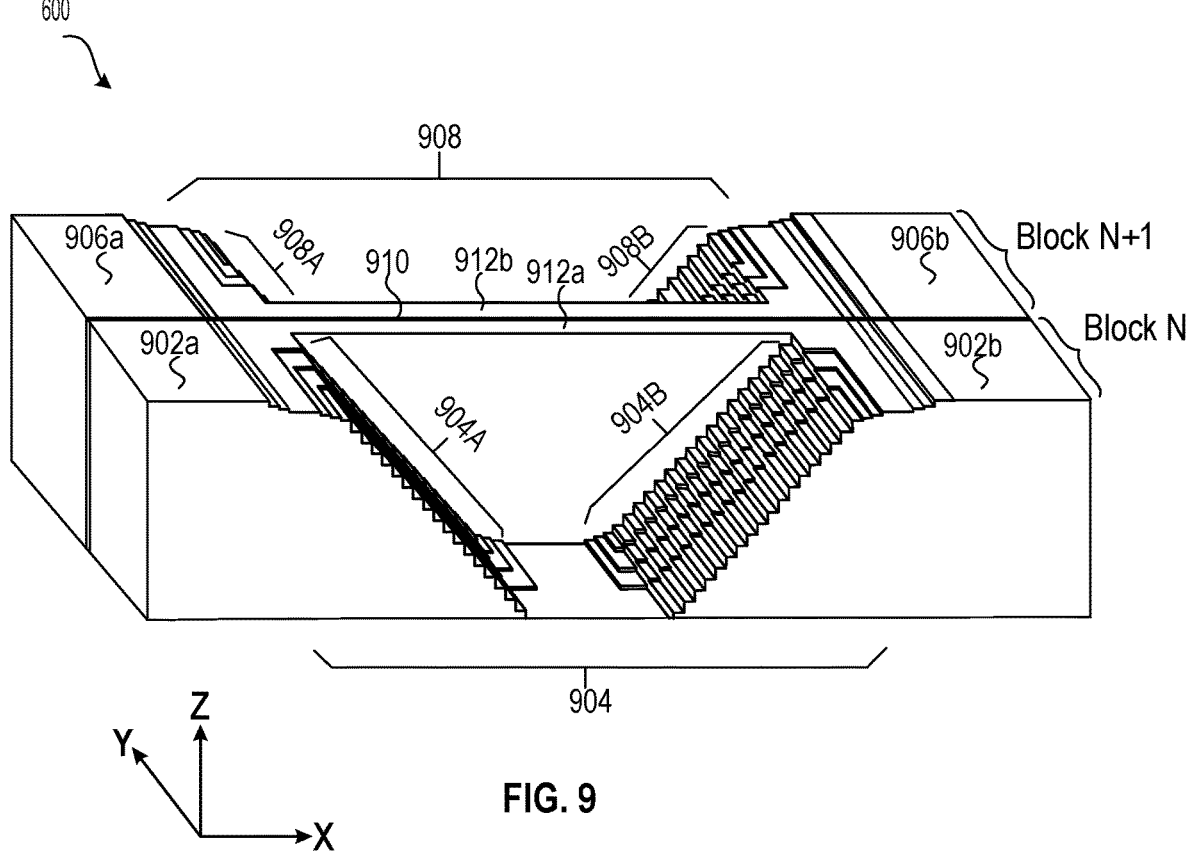

In FIG. 9, the resist trim process and the etching process can be sequentially applied on the sacrificial word line layers and the insulating layers in the first and second staircase regions 604-606 to form a first staircase 904 and a second staircase 908 in the first staircase region 604 and the second staircase region 606 respectively. As shown in FIG. 9, when the resist trim process and the etching process are completed, the stack 600 can have a similar configuration to the stack 300 in FIG. 5.

For example, as shown in FIG. 9, the first staircase 904 includes a first group of stairs 904A extending in a declining step direction (e.g., X direction) in the first section 604A, and a second group of stairs 904B extending in an inclining step direction (e.g., X direction) in the second section 604B. The second staircase 908 has a third group of stairs 908A extending in the declining step direction (e.g., X direction) in the third section 606A, and a fourth group of stairs 908B extending in the inclining step direction (e.g., X direction) in the fourth section 606B. In addition, the first staircase 904 can extend in a lateral step-down direction (e.g., −Y direction) and the second staircase 908 can extend in a direction opposite to the lateral step-down direction (e.g., Y direction).

Furthermore, a connection region 912 that is formed based on the connection region 602 can be arranged between the first and second staircases 904 and 908. A slit structure 910 can be positioned in the connection region 912 and between the first and second staircases 904 and 908. A block N can include first array regions 902a-902b, a first portion 912a of the connection region 912, and the first staircase 904. A block N+1 can include second array regions 906a-906b, a second portion 912b of the connection region 912, and the second staircase 908.

FIG. 10 is a flowchart of a process 1000 for manufacturing the disclosed 3D NAND device in accordance with some embodiments of the present disclosure. The process 1000 begins at step 1004 where an initial stack of sacrificial word line layers and insulating layers can be formed over a substrate of the 3D NAND device. A connection region, a first staircase region, and a second staircase region can be patterned in the initial stack subsequently through a patterning process. The connection region can be positioned between the first staircase region and the second staircase region. In some embodiments, the step 1004 can be performed as illustrated with reference to FIG. 6.

The process 1000 then proceeds to step 1006 where the sacrificial word line layers and insulating layers in the first staircase region can be shaped to form a first stair extending in a first lateral step-down direction (e.g., −X direction), where the first stair divides the sacrificial word line layers and the insulating layers in the first staircase region into a first section and a second section. In step 1008 of the process 1000, sacrificial word line layers and insulating layers can be shaped in a second staircase region to form a second stair extending in the first lateral step-down direction, where the second stair divides the sacrificial word line layers and the insulating layers in the second staircase region into a third section and a fourth section. In some embodiments, the steps 1006 and 1008 can be performed as illustrated with reference to FIG. 7.

In step 1010 of the process 1100, the sacrificial word line layers and the insulating layers in the first staircase region can be shaped to form one or more stairs extending in a second lateral step-down direction (e.g., −Y direction), where the second lateral step-down direction is perpendicular to the first lateral step-down direction (e.g., −X direction). In step 1012 of the process 1000, the sacrificial word line layers and the insulating layers in the second staircase region can be shaped to form one or more stairs extending in a direction opposite to the second lateral step-down direction (e.g., Y direction). In some embodiments, the steps 1010 and 1012 can be performed as illustrated with reference to FIG. 8.

The process 1000 then proceed to step 1014 where a resist trim process and an etching process can be operated sequentially on the sacrificial word line layers and the insulating layers in the first and second staircase regions to form the first staircase and the second staircase in the first staircase region and the second staircase region respectively. In some embodiments, the step 1014 can be performed as illustrated with reference to FIG. 9.

It should be noted that additional steps can be provided before, during, and after the process 1000, and some of the steps described can be replaced, eliminated, or performed in different order for additional embodiments of the process 1000. For example, in subsequent process steps, channel structures can be formed in two array regions of the initial stack, where the channel structures extend from the substrate and extend through the sacrificial word line layers and the insulating layers in the two array regions, and the connection region of the initial stack. A plurality of slit structures can be formed, and the sacrificial word line layers can be replaced with a conductive material to form word line layers. Further, first contact structures can be formed on the first staircase, and second contact structures can be formed on the second staircase. The first contact structures are connected to the word line layers in the first staircase, and the second contact structures are connected to the word line layers in the second staircase.

Moreover, various additional interconnect structures (e.g., metallization layers having conductive lines and/or vias) may be formed over the first and second contact structures of the 3D NAND device. Such interconnect structures electrically connect the 3D NAND device with other contact structures and/or active devices to form functional circuits. Additional device features such as passivation layers, input/output structures, and the like may also be formed.

The various embodiments described herein offer several advantages over related memory devices. For example, in the present disclosure, the 3D NAND device can have a plurality of memory planes. Each of the memory planes can have a corresponding decode structure disposed at a middle position of the memory plane. Thus each of the memory planes can be driven by the corresponding decode structure along a direction from the middle position of the memory plane to two sides of the memory plane, and an effective flow length of the driven currents is accordingly reduced by half comparing to a driven current in a related 3D NAND device. Thus, a total resistance can be reduced by the reduced flow length, which in turns compensates an increased sheet resistance due to the reduced layer (or film) dimensions in the 3D NAND device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a stack of alternating word line layers and insulating layers;
   a first block having a first staircase that is formed in the stack and extends between first array regions;
   a second block having a second staircase that is formed in the stack and extends between second array regions; and
   channel structures that are formed in the first and second array regions and extend through the stack, wherein:
   the first staircase has stairs declining in a first lateral direction and a second lateral direction that is perpendicular to the first lateral direction, and
   the first staircase is spaced apart from the second staircase along the second lateral direction.

2. The semiconductor device of claim 1, further comprising a connection region formed in the stack such that the first array regions and the first staircase are positioned at a first side of the connection region, and the second array regions and the second staircase are positioned at a second side of the connection region.

3. The semiconductor device of claim 1, further comprising a slit structure positioned between the first staircase and the second staircase.

4. The semiconductor device of claim 3, wherein the slit structure has a main surface extending along the first lateral direction and a thickness direction along the second lateral direction.

5. The semiconductor device of claim 3, wherein the slit structure is positioned between the first block and the second block.

6. The semiconductor device of claim 3, wherein the slit structure comprises a conductive material.

7. The semiconductor device of claim 3, wherein the slit structure comprises a dielectric material.

8. The semiconductor device of claim 1, further comprising a connection region positioned between the first staircase and the second staircase along the second lateral direction.

9. The semiconductor device of claim 1, wherein the first staircase has a plurality of sub-staircases each declining in the second lateral direction.

10. A semiconductor device, comprising:

a stack of alternating word line layers and insulating layers;

a first block having a first staircase that is formed in the stack and extends between first array regions;

a second block having a second staircase that is formed in the stack and extends between second array regions;

a connection region positioned between the first staircase and the second staircase; and channel structures that are formed in the first and second array regions and extend through the stack, wherein:

the first staircase has stairs declining in a first lateral direction, and the first staircase is spaced apart from the second staircase along a second lateral direction that is perpendicular to the first lateral direction.

11. The semiconductor device of claim 10, wherein the connection region is positioned between the first staircase and the second staircase along the second lateral direction.

12. The semiconductor device of claim 10, wherein the channel structures are also formed in the connection region.

13. The semiconductor device of claim 10, wherein the first staircase has stairs extending in a declining step direction and stairs extending in an opposing inclining step direction.

14. The semiconductor device of claim 13, wherein the stairs of the first staircase further extend in a lateral step-down direction that is perpendicular to the inclining and declining step directions.

15. The semiconductor device of claim 14, wherein the second staircase has stairs extending in the declining step direction and stairs extending in the opposing inclining step direction.

16. The semiconductor device of claim 15, wherein the stairs of the second staircase further extend in a direction opposite to the lateral step-down direction that is perpendicular to the declining and inclining step directions.

17. The semiconductor device of claim 10, further comprising:

first contact structures formed on the first staircase and connected to the word line layers in the first staircase; and second contact structures formed on the second staircase and connected to the word line layers in the second staircase.

18. The semiconductor device of claim 17, wherein the first staircase and the second staircase are coupled to a decode structure respectively through the first contact structures and the second contact structures.

19. The semiconductor device of claim 10, further comprising a slit structure positioned in the connection region between the first staircase and the second staircase, and dividing the connection region into a first portion and a second portion.

20. The semiconductor device of claim 19, wherein:

the first block includes the first portion of the connection region, the first array regions, and the first staircase, the first portion of the connection region being arranged adjacent to the first staircase and connected to the first array regions, and the second block includes the second portion of the connection region, the second array regions, and the second staircase, the second portion of the connection region being arranged adjacent to the second staircase and connected to the second array regions.

* * * * *